United States Patent
Tanaka et al.

(10) Patent No.: US 7,901,853 B2
(45) Date of Patent: Mar. 8, 2011

(54) PATTERN PREDICTION METHOD, PATTERN CORRECTION METHOD, SEMICONDUCTOR DEVICE, AND RECORDING MEDIUM

(75) Inventors: Satoshi Tanaka, Kanagawa (JP); Masaki Satake, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 12/395,398

(22) Filed: Feb. 27, 2009

(65) Prior Publication Data

US 2009/0233193 A1 Sep. 17, 2009

(30) Foreign Application Priority Data

Feb. 29, 2008 (JP) ................................ 2008-050804

(51) Int. Cl.
*G03F 9/00* (2006.01)
*G06F 17/50* (2006.01)
(52) U.S. Cl. ................................ 430/30; 430/5; 716/53
(58) Field of Classification Search ................ 430/5, 30; 716/53
See application file for complete search history.

(56) References Cited

U.S. PATENT DOCUMENTS

2008/0004852 A1  1/2008  Satake et al.

FOREIGN PATENT DOCUMENTS

JP  11-102062  4/1999

*Primary Examiner* — Christopher G Young
(74) *Attorney, Agent, or Firm* — Finnegan, Henderson, Farabow, Garrett & Dunner, L.L.P.

(57) ABSTRACT

A pattern prediction method according to an embodiment includes: predicting a second pattern shape from a first pattern shape by using a conversion function and a conversion difference residual error amount function, wherein; the conversion function makes the connection between the first pattern formed by a first step and the second pattern formed by a second step following the first step based on contour shapes of the first pattern and the second pattern, and the conversion difference residual error amount function makes the connection between a residual error amount between a predicted shape of the second pattern obtained from the conversion function and the second pattern shape obtained by actually using the second step, and factors other than the contour shapes of the first pattern and the second pattern.

18 Claims, 18 Drawing Sheets

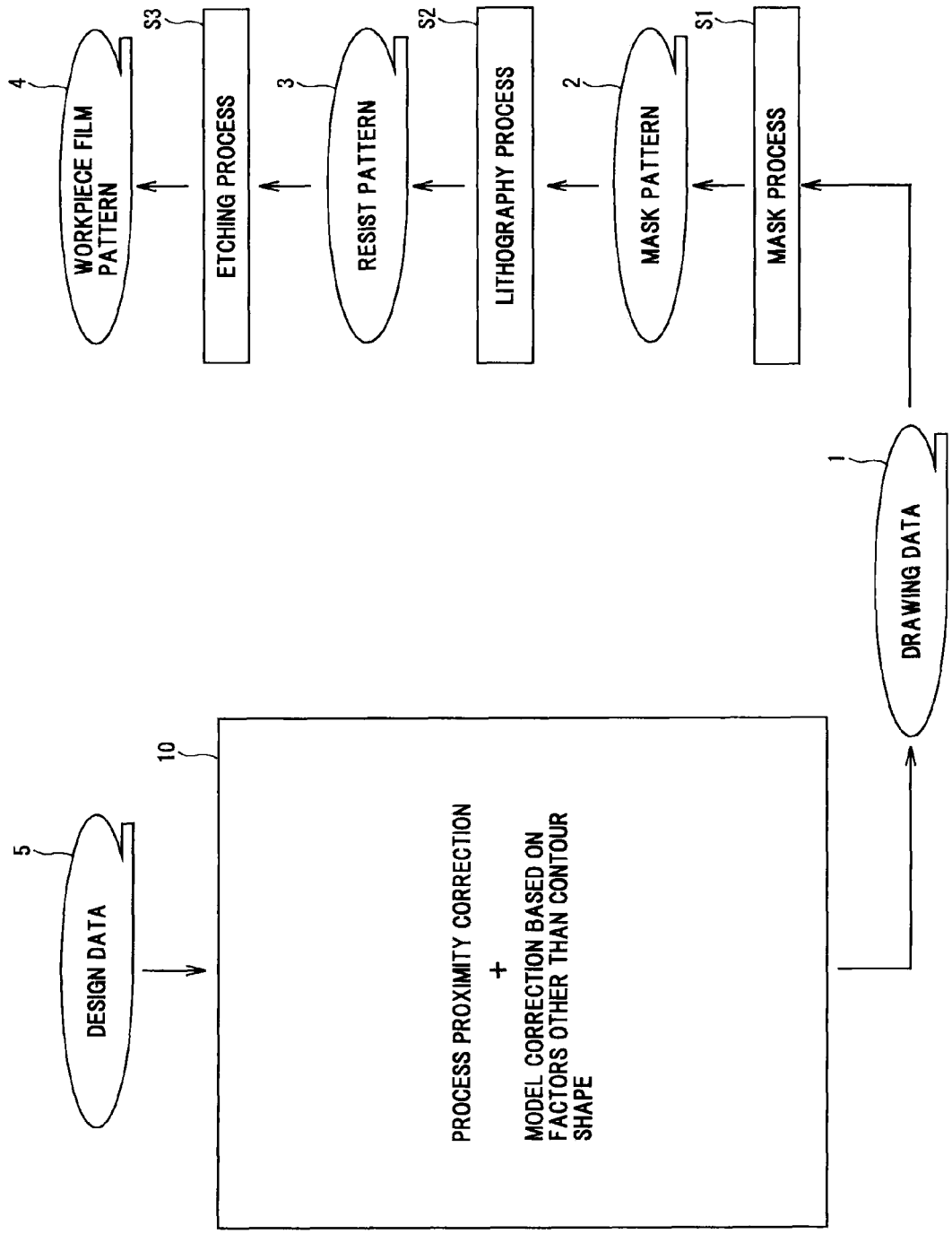

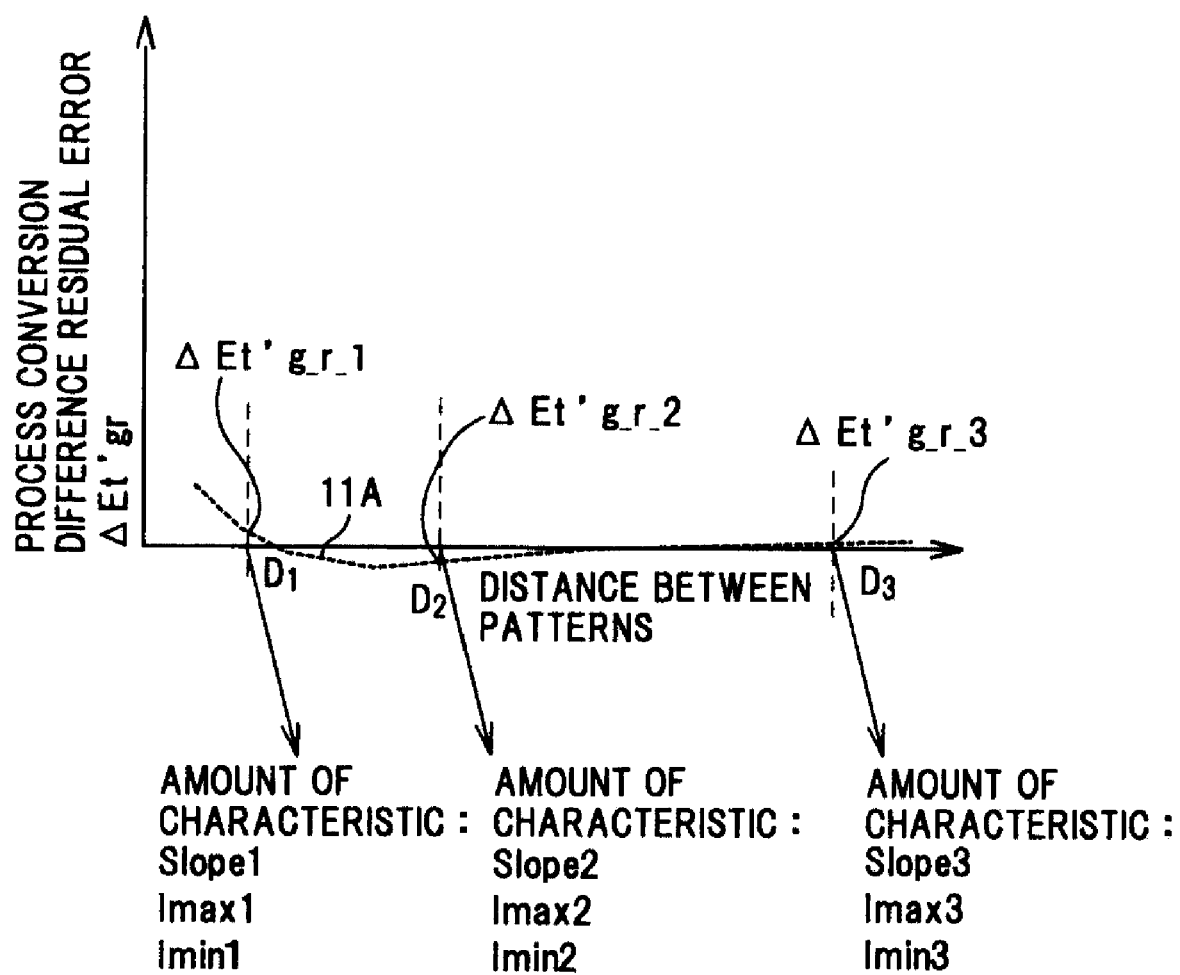

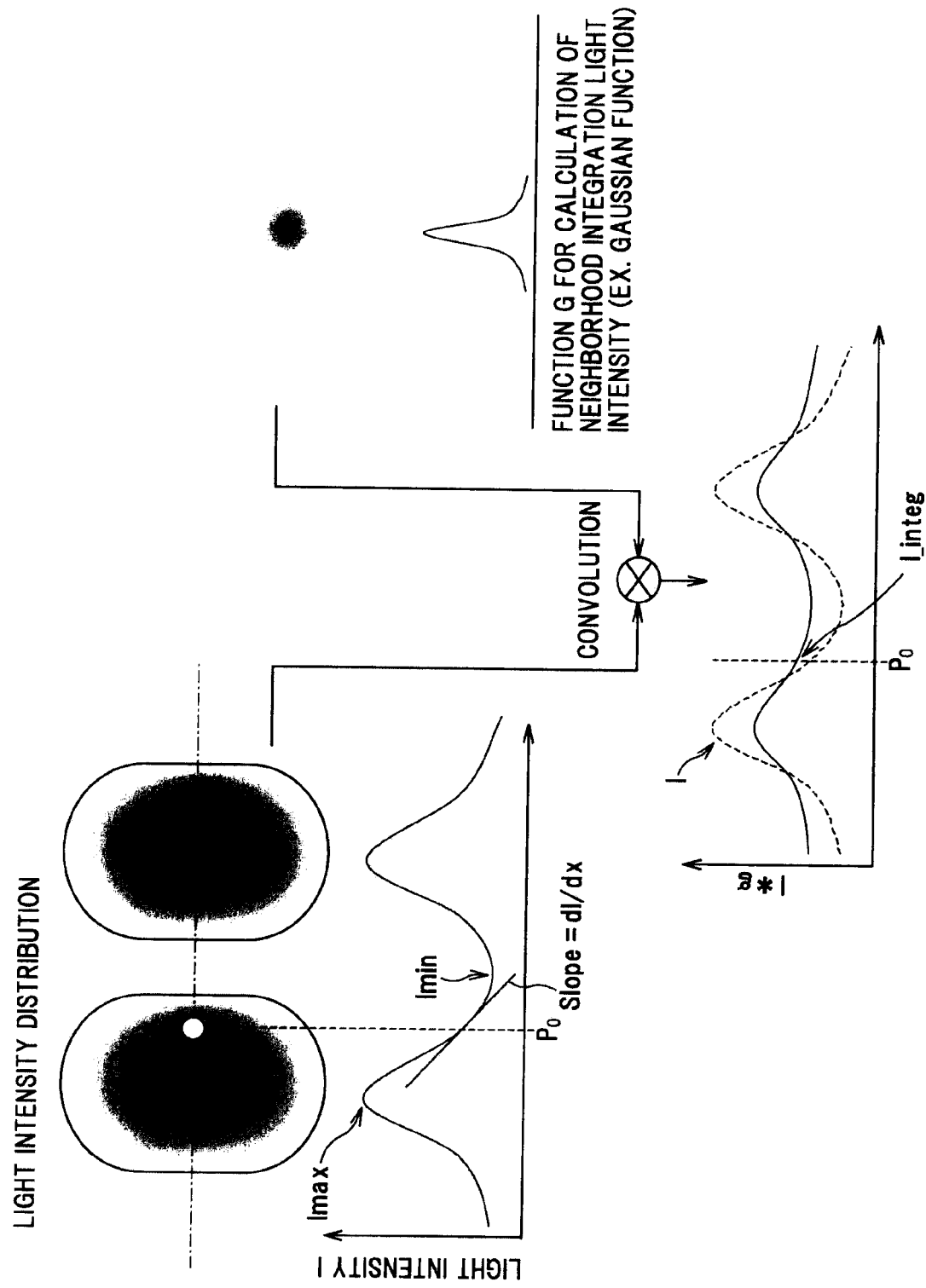

FIG.8A 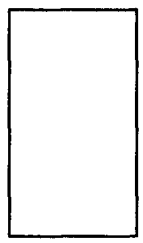  — 5 DESIGN DATA
FIG.8B 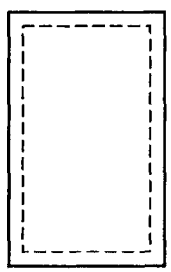 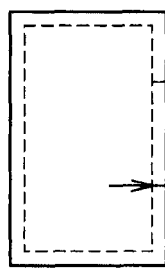
— 5
— 12 LITHOGRAPHY TARGET
— DEFORM BY REPRESENTATIVE VALUE
FIG.8C 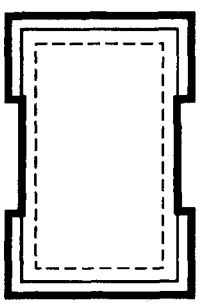 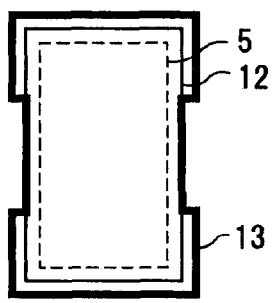
— 5
— 12
— 13 MASK PATTERN SHAPE
FIG.8D 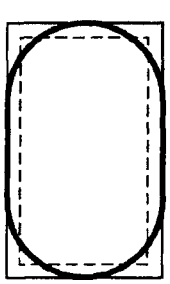 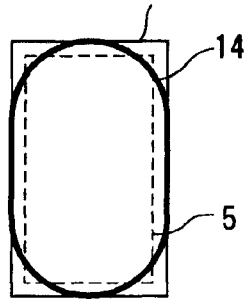
— 12
— 14 PATTERN SHAPE AFTER LITHOGRAPHY PREDICTED BY LITHOGRAPHY CONVERSION DIFFERENCE MODEL
— 5

OPTICAL IMAGE

- 12
- 14 PATTERN SHAPE AFTER LITHOGRAPHY PREDICTED BY LITHOGRAPHY CONVERSION DIFFERENCE MODEL
- 15 PATTERN SHAPE AFTER LITHOGRAPHY PREDICTED BY (LITHOGRAPHY CONVERSION DIFFERENCE MODEL+PROCESS CONVERSION DIFFERENCE RESIDUAL ERROR AMOUNT MODEL)

PATTERN PREDICTION METHOD, PATTERN CORRECTION METHOD, SEMICONDUCTOR DEVICE, AND RECORDING MEDIUM

CROSS REFERENCE TO RELATED APPLICATIONS

This application is based upon and claims the benefit of priority from prior Japanese Patent Application No 2008-050804, filed on Feb. 29, 2008, the entire contents of which are incorporated herein by reference.

BACKGROUND

Accompanying the miniaturization of LSI in recent years, Process Proximity Effects (PPE) has been actualized, PPE meaning a phenomenon that a pattern can not be transcribed onto a wafer as a design pattern in a process (lithography process) etc. of forming a design pattern to an exposure original plate (mask or reticulum) without change, transcribing in reduced size it to the water via an exposure device and forming a resist pattern. Therefore, Process Proximity Correction (PPC) has been needed, where PPC means a technology that the pattern after the transcription can be shaped as the desired design pattern by using a mask pattern corrected in the pattern dimension and the shape.

For the PPC, a method of forming mask data is proposed, the method including that the design data are corrected and the mask data are formed. This method is, for example, disclosed in JP-A-H11 (1999)-102062.

In the method of forming mask data, the mask data is formed by that such corrections as an etching process correction, a lithography process correction and a mask process correction are applied sequentially to the design data in this order.

However, according to the method of forming mask data, corrections are performed based on planar (two-dimensional) shapes of patterns formed in each process step so that it is difficult to predict the shapes with a high degree of accuracy. For example, resist shapes and fabrication shapes to be needed at the etching process correction are regarded as planar shapes so that it is difficult to reflect variations of the fabrication shapes according to cross-sectional shapes of the resist. On the other hand, if three-dimensional shape data are used, the processing time becomes lengthened.

BRIEF SUMMARY

A pattern prediction method of an embodiment comprises: predicting a second pattern shape from a first pattern shape by using a conversion function and a conversion difference residual error amount function, wherein; the conversion function makes the connection between the first pattern formed by a first step and the second pattern formed by a second step following the first step based on contour shapes of the first pattern and the second pattern, and the conversion difference residual error amount function makes the connection between a residual error amount between a predicted shape of the second pattern obtained from the conversion function and the second pattern shape obtained by actually using the second step, and factors other than the contour shapes of the first pattern and the second pattern.

BRIEF DESCRIPTION OF THE DRAWING

FIG. 1 is an explanatory view schematically showing a pattern prediction method and pattern correction method according to the first embodiment.

FIGS. 6A to 6C are explanatory views showing preparation examples of the etching process bias residual error amount model.

FIG. 7 is an explanatory view showing a calculation method of a neighborhood integration light intensity (I integ).

FIGS. 8A to 8I are explanatory views showing cases that correction flows are applied to particular patterns.

DETAILED DESCRIPTION

First Embodiment

Figure 2A:
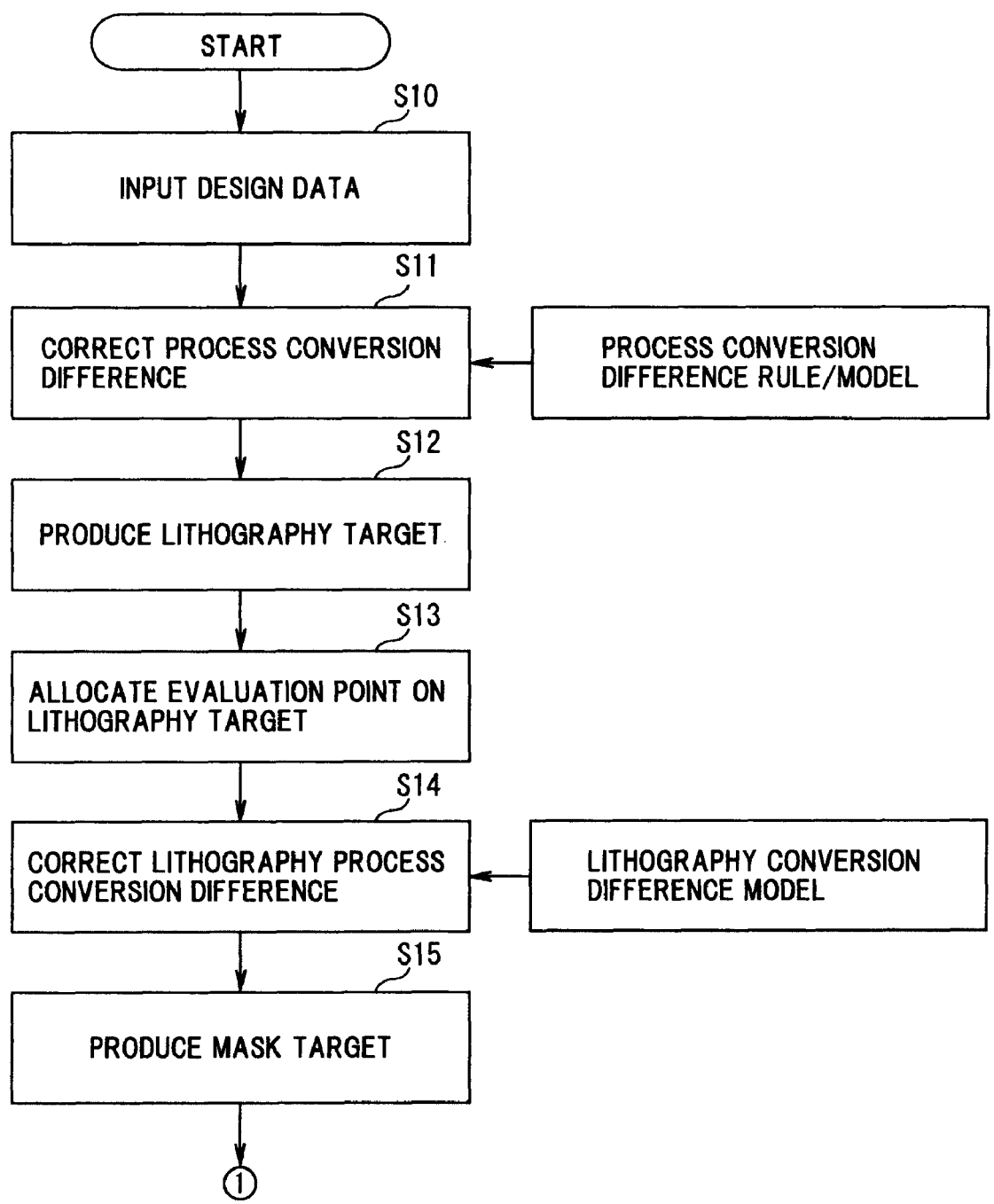
FIGS. 2A to 2B are flowcharts showing contents of corrections.

FIG. 1 is an explanatory view schematically showing a pattern prediction method and pattern correction method according to the first embodiment. The right flow thereof shows a formation flow of a workpiece file pattern and the left flow thereof shows a Process Proximity Correction (PPC) flow to which the pattern prediction method and pattern correction method according to the first embodiment is applied.

In the formation flow of the workpiece file pattern, a workpiece film pattern 4 is formed via a mask process S1, a lithography process S2 and an etching process S3.

The workpiece film pattern 4 includes patterns obtained by fabricating the workpiece films formed on a semiconductor substrate such as an insulating film, a semiconductor film, a conductive film or the like to desired shapes.

The mask process S1 is a process for forming a mask pattern 2 to become an original plate by an electron beam drawing based on drawing data 1. The lithography process 32 is a process for forming a resist pattern 3 on the workpiece film by exposing and developing the resist via the mask pattern 2. The etching process S3 is a process for etching the workpiece film by using the resist pattern 3 as a mask.

In the Process Proximity Correction (PPC) flow, in order to obtain the workpiece film pattern 4 as the design data 5, corrections 10 including the Process Proximity Correction (PPC) are applied to the design data and the drawing data 1 for forming the mask pattern 2 are produced.

Conventional PPC means a technology for correcting patterns based on the contour shapes thereof, responding to not only dimensional variations generated in the lithography process S2 but also to dimensional variations generated in the mask process S1, the lithography process S2 and the etching process S3. However, simply by using the above-mentioned PPC, it is impossible to exactly calculate various etching process biases caused by the mask process S3, the lithography process S2 and the etching process S3, and to form the desired patterns.

Here, the etching process biases include "a mask process conversion difference", "a lithography conversion difference", and "an etching process bias". "A mask process conversion difference" means a dimensional difference between the drawing data of the mask pattern and the mask pattern formed on a mask substrate, "a lithography conversion difference" means a dimensional difference between the mask pattern and the resist pattern after the lithography process, and "an etching process bias" means a dimensional difference between the resist pattern and a pattern dimension after the etching process.

Further, in the present embodiment and the subsequent embodiments, when a pattern before conversion by a predetermined process is defined as a first pattern, a pattern after being converted by the process and the subsequent processes, is referred as a second pattern. And, a pattern obtained by converting the second pattern by the process after formation process of the second pattern, is referred as a third pattern. In the subsequent processes, patterns after the conversion processes can be also defined in the same manner.

In order to solve the above-mentioned problem, the present embodiment makes it possible to predict pattern shapes with a high degree of accuracy and correct based on the result of the prediction of the pattern shapes, by means of carrying out a model correction based on factors other than the contour shapes of the patterns in addition to the PPC based on the contour shapes thereof.

[Flow of Proximity Effects]

Figure 2B:
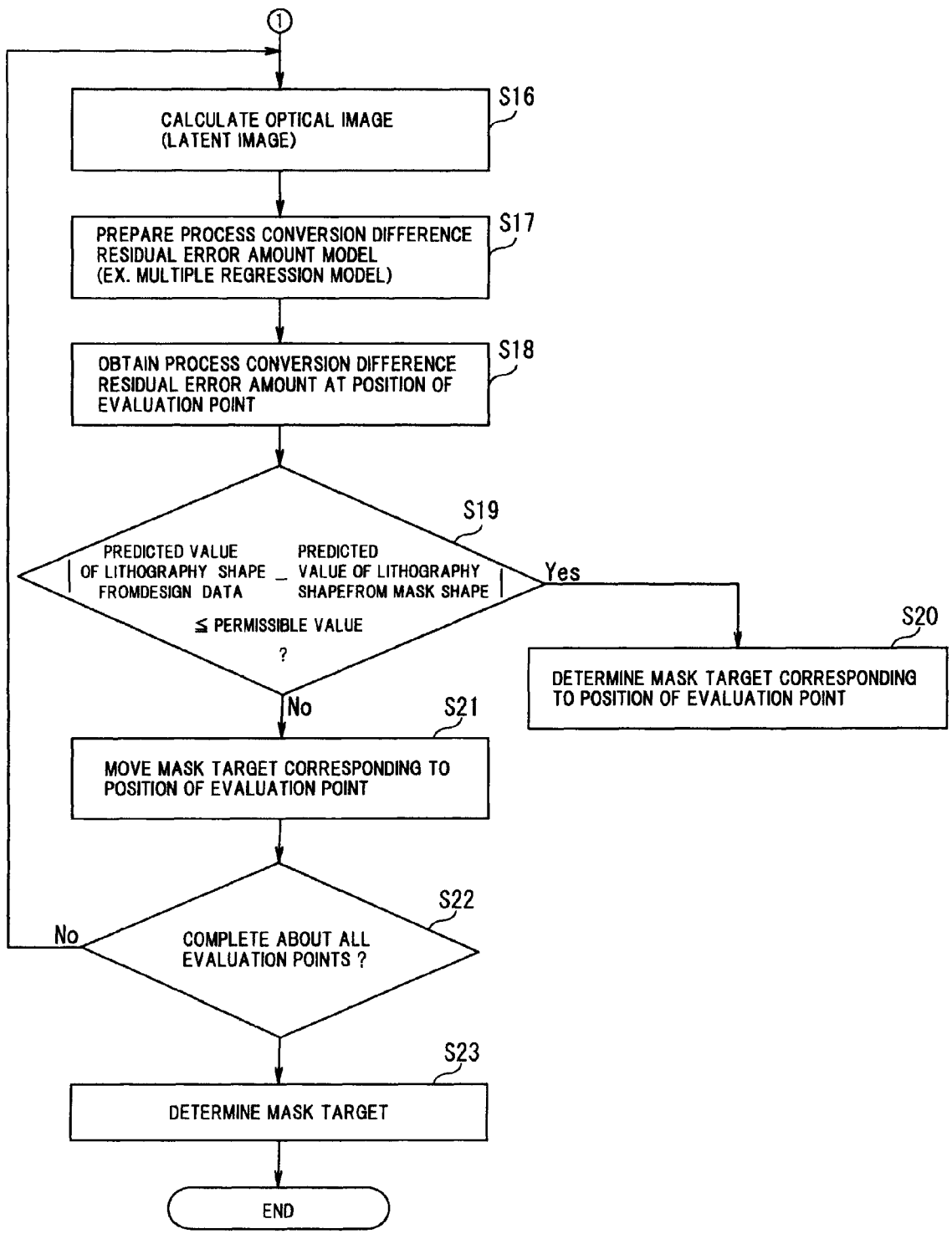

FIGS. 2A to 2B are flowcharts showing contents of corrections 10. To begin with, as shown in FIG. 2A, a design data 5 is input (S10). Next, in view of an etching process bias due to an etching process, a correction (etching process bias correction) using an etching process bias model is carried out to the design data 5 (S11). Further, instead of the correction using the etching process bias model, a predetermined etching process bias rule can be used for the correction, where the rule defines a relationship between the contour shapes of correction object pattern data and a correction guideline to the pattern data.

Here, "an etching process bias model" and "an etching process bias rule" mean functions that make the connection between a resist pattern and a pattern after an etching process based on the contour shapes of patterns.

Further, in the present embodiment and the subsequent embodiments, a function for making the connection between the contour shapes of patterns including a first pattern and a second pattern before and after a predetermined process is referred as a first function. And, a function for making the connection between the contour shapes of patterns including the second pattern and a third pattern is referred as a second function. In the subsequent processes, conversion functions that make the connection between the pattern shapes can be also defined in the same manner.

Figure 3A:
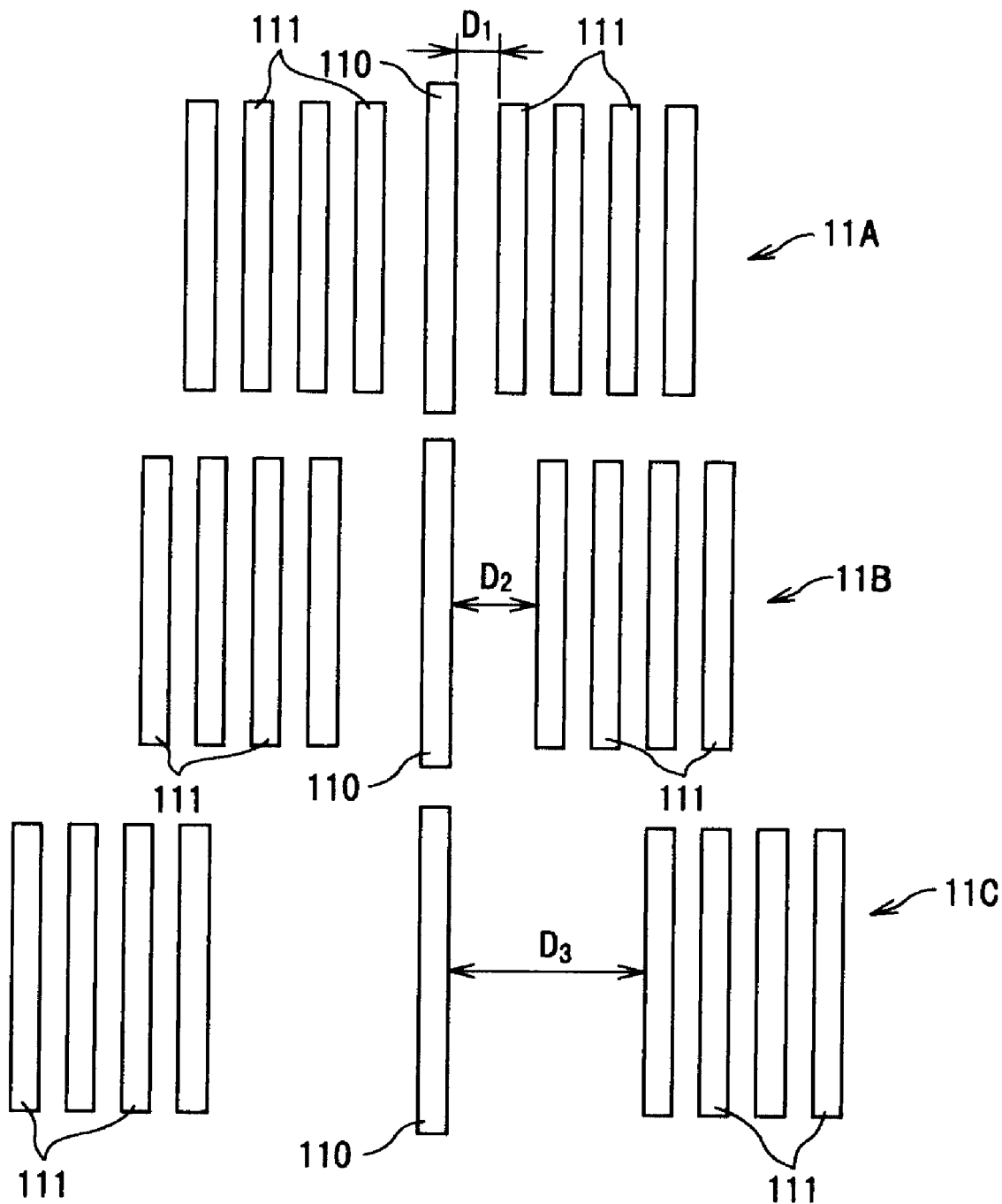
FIGS. 3A to 3C are explanatory views showing preparation examples of etching process bias models.
Figure 3B:
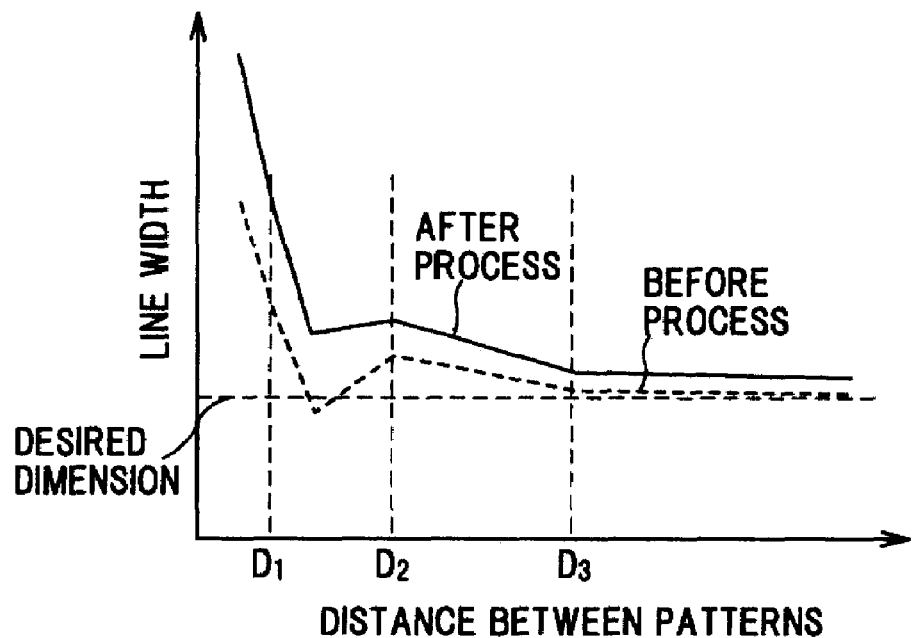
Figure 3C:
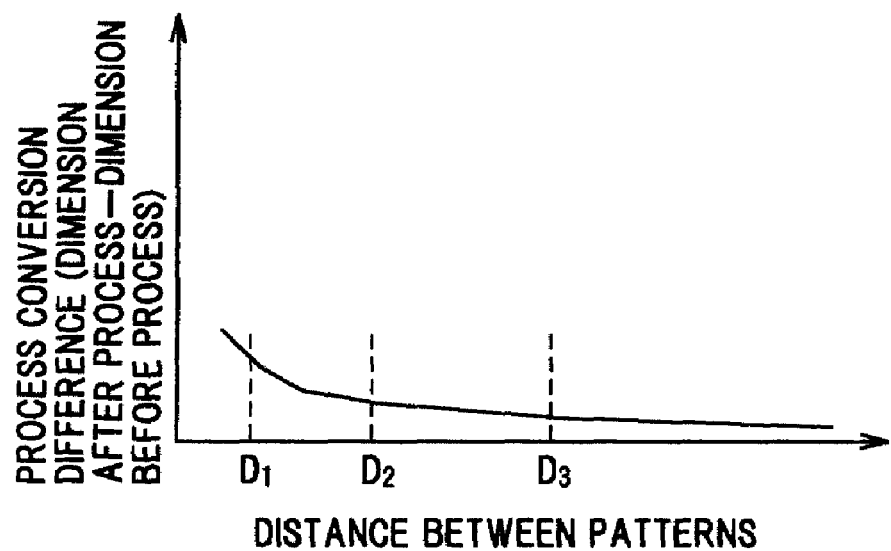
Figure 4:
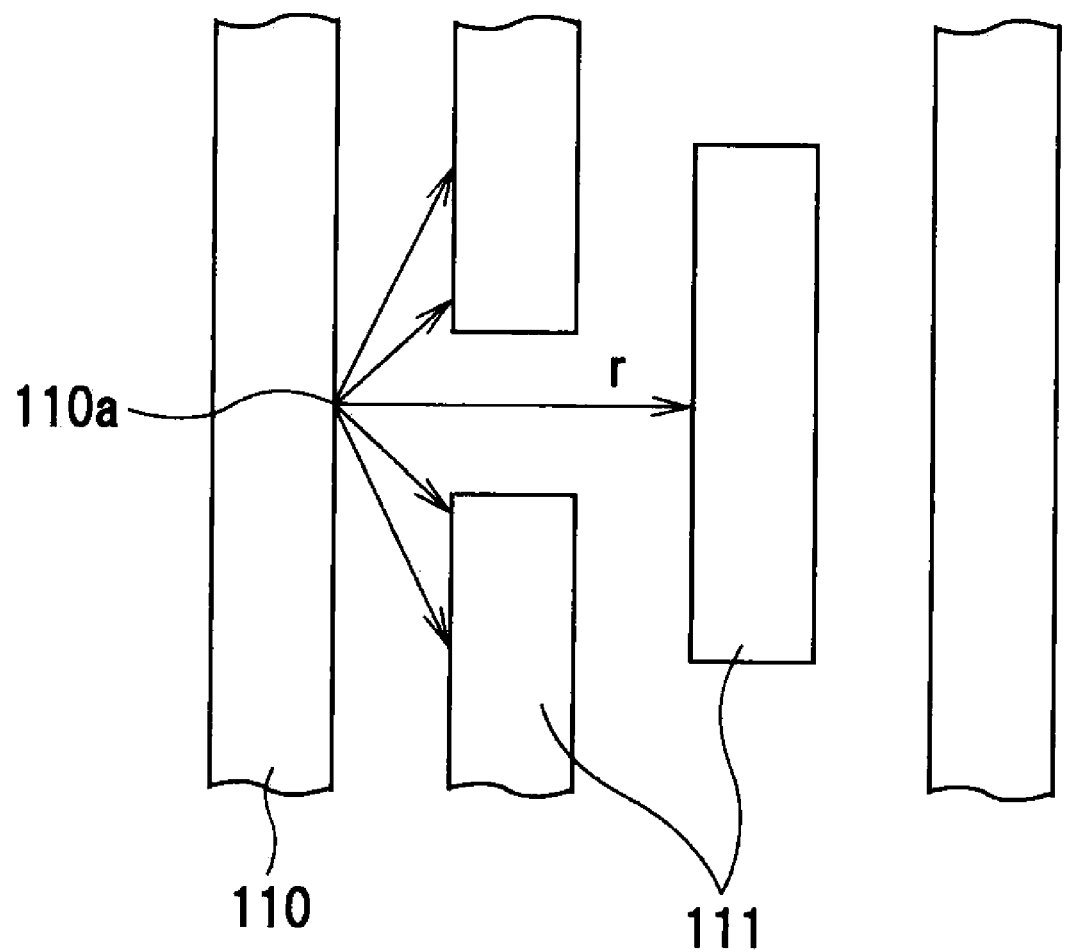
FIG. 4 is an explanatory view showing a formula of the etching process bias model.

FIGS. 3A to 3C are explanatory views showing preparation examples of etching process bias models, and FIG. 4 is an explanatory view showing a formula of the etching process bias model.

The etching process bias depends on dimensions from the correction object pattern to the neighboring patterns neighboring thereto, and the contour shapes of patterns such as a pattern density around the correction object pattern, so that the etching process bias model can be prepared based on the contour shapes of patterns, For example, as shown in FIG. 3A, test patterns 11A, 11B, 11C having different dimensions (distances) D1, D2, D3 from the correction object pattern 110 to the neighboring patterns 111 neighboring to the correction object pattern 110 are fabricated, as shown in FIG. 3B, with regard to the correction object pattern 110 of these test patterns 11A, 11B, 11C, a line width dimension after the lithography process (before the process) and a line width dimension after the etching process (after the process) are measured, as shown in FIG. 3C, a difference between both widths (etching process bias) is obtained, and the relationship between the contour shapes of patterns before the process conversion and the etching process bias is obtained by a regression calculation or a fitting, so that an etching process bias model is prepared. An etching process bias rule is obtained by defining the relationship between the contour shapes of patterns before the process conversion and the etching process bias based on the pattern shapes.

The etching process bias model/rule can be represented as, for example, F etg (P resist (r)). In this regard, P resist (r) is a function for defining the resist pattern shape. As shown in FIG. 4, the symbol (r) denotes a distance on an x-y plane from a remarkable point 110a of the correction object pattern 110 to the neighboring patterns 111.

The pattern before the process is corrected appropriately and repeatedly (S11) so as to obtain the pattern after the process which is as the design pattern or within a permissible difference from the design pattern, by predicting the pattern after the process from the pattern before the process by using the above-mentioned the etching process bias model/rule, and the appropriate pattern before the process, namely a lithography target is produced (S12). The correction is carried out by that, for example, a plurality of evaluation points are allocated on the design pattern, a distance from each of the evaluation points to the pattern after the process is measured, and the pattern before the process corresponding to each of the evaluation points is repeatedly corrected until the measured distance becomes less than a predetermined threshold value. Here, the lithography target is a target on the data, and a target pattern for showing the resist pattern to be formed onto the resist used for forming an appropriate pattern after the process. Further, the lithography target can be calculated from the design pattern shape by using an inverse function derived from the etching process bias model/rule.

Next, the evaluation points are allocated on the contour of the lithography target (S13), in view of a lithography process conversion difference due to the lithography process, a correction (lithography conversion difference correction) using a lithography conversion difference model (conversion function) is carried out (applied) to the lithography target (S14), and a mask target is produced (S15). As the method for the correction, the same method as one used for the production of the pattern before the process can be used. Here, the mask target is a target on the data, and a target pattern for showing the mask pattern to be formed onto a mask used for forming an appropriate resist pattern.

Here, "an etching process bias model/rule" means a function for making the connection between the mask pattern and the resist pattern based on the contour shapes of patterns. The lithography conversion difference model can be represented as F litho (P mask (r)). In this regard, F litho (P mask (r)) is a function for defining the mask pattern shape. Further, hereinafter, the description of "a conversion difference model" includes a meaning of "a conversion difference rule".

The lithography conversion difference depends on dimensions from the correction object pattern to the neighboring patterns neighboring thereto and the contour shapes of patterns such as a pattern density around the correction object pattern, so that the etching process bias model based on the contour shapes of patterns can be prepared by fabricating test patterns shown in FIG. 3A, measuring distances between patterns and obtaining a lithography conversion difference according to the distances between the patterns.

Figure 5A:
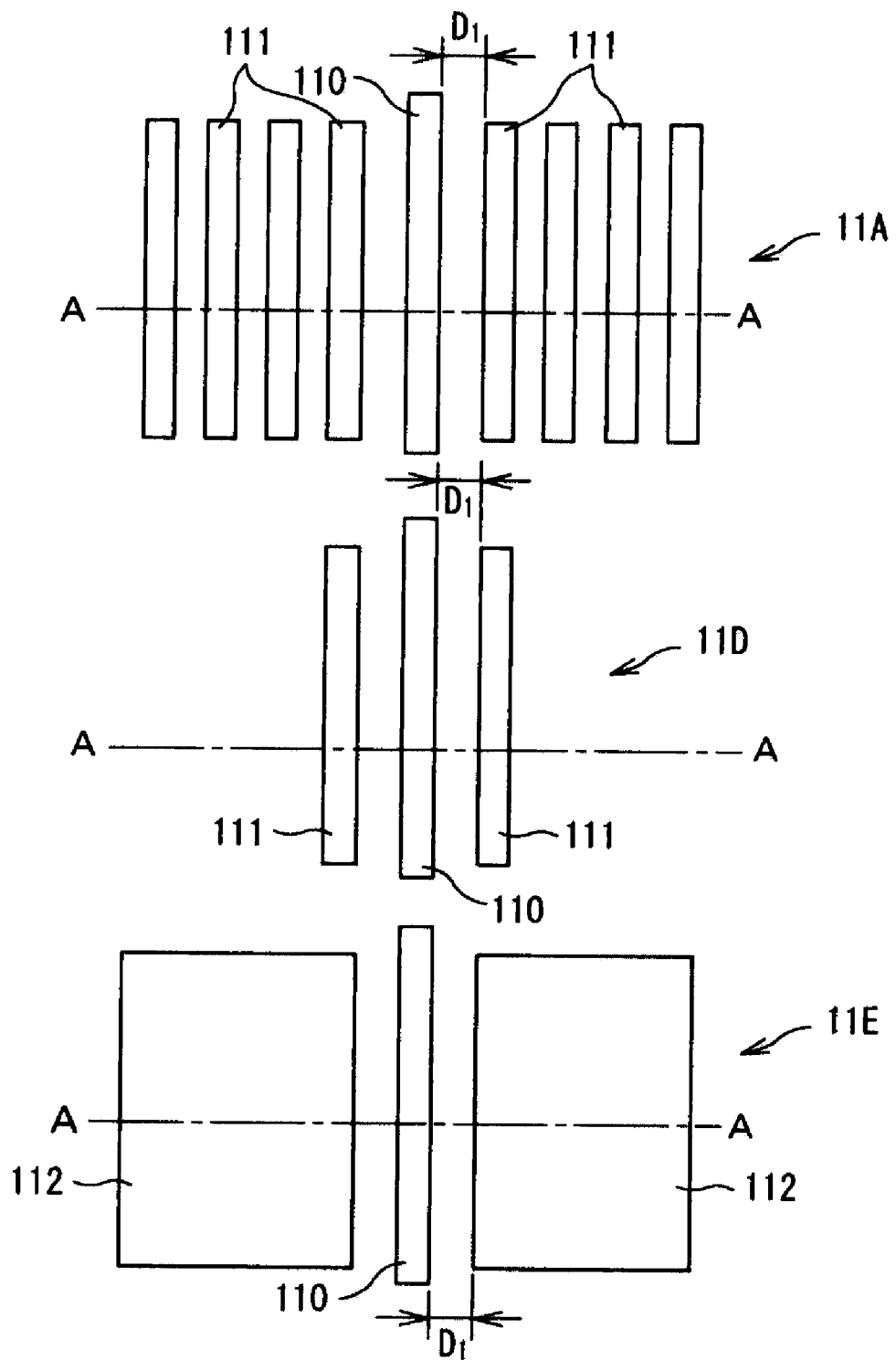
FIGS. 5A to 5C are explanatory views showing relationships between a light intensity distribution and an etching process bias formed in a resist film.
Figure 5B:
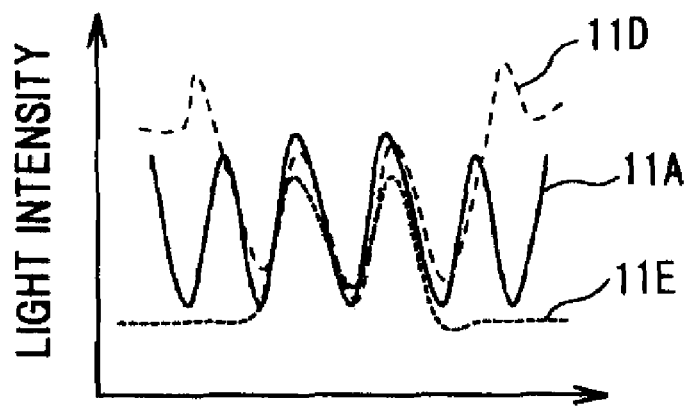
Figure 5C:
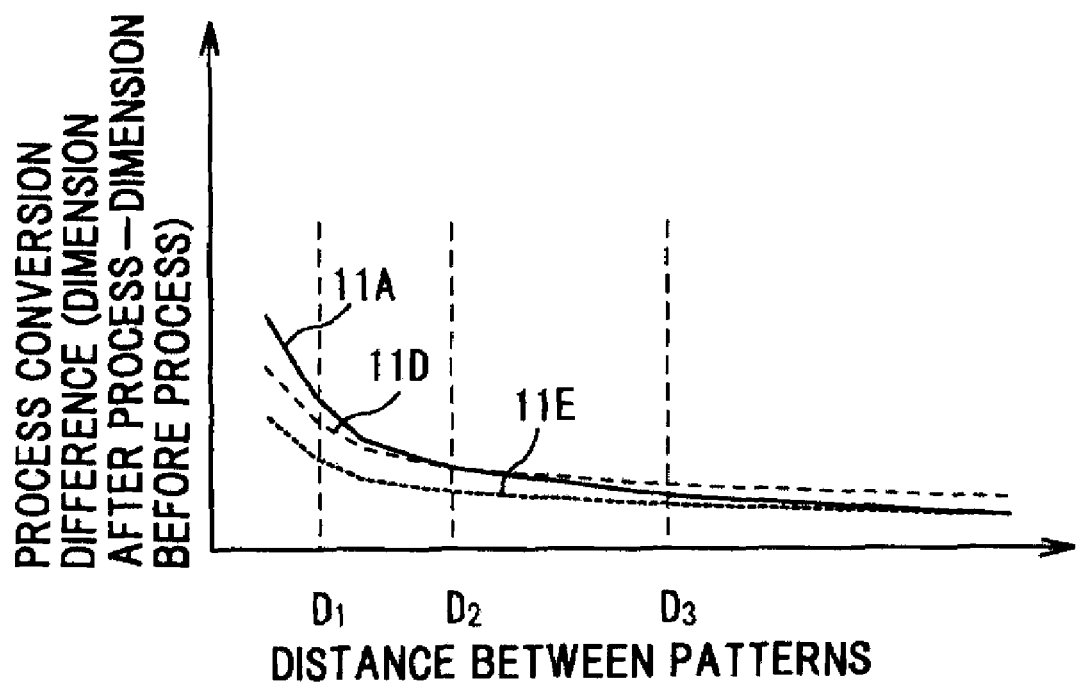

FIGS. 5A to 5C are explanatory views showing relationships between a light intensity distribution and an etching process bias formed, in a resist film. Even if the distances between the patterns after the lithography process are equal, the light intensity distributions (optical images or latent images) formed in the resist pattern of a mask material are different due to various factors such as a three-dimensional shape of the pattern, so that the etching process bias become different. For example, as shown in FIG. 5A, when the distance D1 from the correction object pattern 110 to the neighboring patterns 111 is equalized, and the test patterns 11A, 11D, 11E having a difference in the number (allocation) and shape of the neighboring patterns 111 are fabricated, and then the light intensity distributions on the line A-A in FIG. 5A about these test patterns are obtained, as shown in FIG. 5B, the light intensity distributions are different according to the allocation and the like of the test patterns 11A, 11D, 11E, and as shown in FIG. 5C, the etching process biases are also different. This is due to a difference in the three-dimensional shape such as the height of each portion and the edge inclination of the resist pattern. The etching process biases at the distances D2, D3 between the patterns shown in FIG. 5C is an etching process bias defined when the distances from the correction object pattern 110 to the neighboring patterns 111 in the test patterns 11A, 11D, 11E are determined as D2 and D3 as in the case of FIG. 5A.

As explained above, since the light intensity distribution formed in the resist film influences the etching process bias, in the present invention, corrections described below are carried out.

To begin with, optical images (latent images) are calculated base on the mask data which becomes the target determined in the step S15 (S16), amounts of characteristic at the evaluation point positions are calculated from the optical images, and the etching process bias residual error amount model is prepared (S17).

Here, "an etching process bias residual error amount model" means a function (conversion difference residual error amount function) for making the connection between the residual error amount between the predicted shape of the final pattern obtained from the etching process bias model and the pattern shape actually obtained by the etching process, and the amount of characteristic (factor other than contour shapes of patterns) of the light intensity distribution formed in the resist film in the lithography process.

In the present embodiment, a following function is referred as a first conversion difference residual error amount function, the function that makes the connection between the residual error amount between the second pattern shape predicted from the first pattern shape by using a first conversion function making the connection between the pattern shapes in the processes and the pattern shape obtained by actually applying the process to the first pattern and factors other than the contour shapes of the first and second patterns. Further, a function for making the connection between the residual error amount between the third pattern shape predicted from the second pattern shape by using a second conversion function making the connection between the pattern shapes in the processes and the third pattern shape obtained by actually applying the process to the second pattern and factors other than the contour shapes of the second and third patterns is referred as a second conversion difference residual error amount function. With regard to the relationship between the residual error amounts of the pattern shapes in the subsequent processes, the conversion difference residual error amount function can be also defined in the same manner. The conversion difference residual error amount function includes, for example, not only the etching process bias residual error amount model, but also a lithography conversion difference residual error amount model making the connection between the residual error amount in the lithography process and factors other than the contour shapes of the mask pattern and the resist pattern such as an electron beam intensity contribution formed in a mask substrate described below.

Figure 6A:
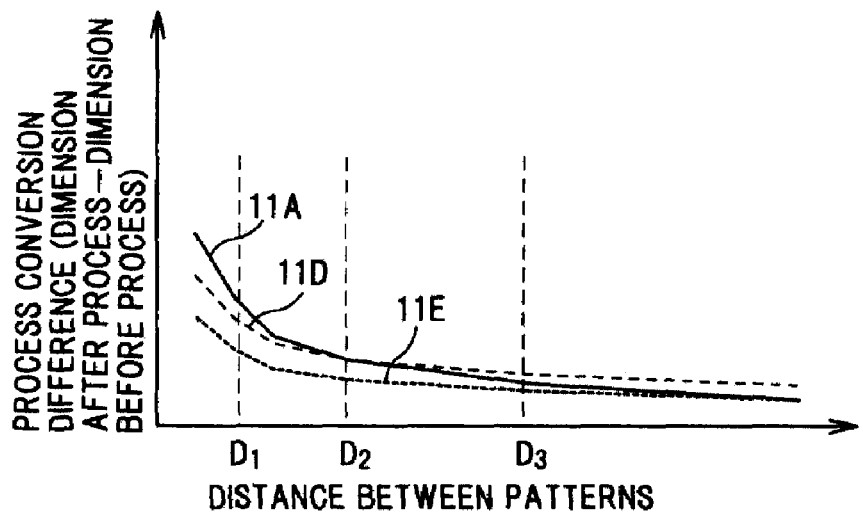
Figure 6B:
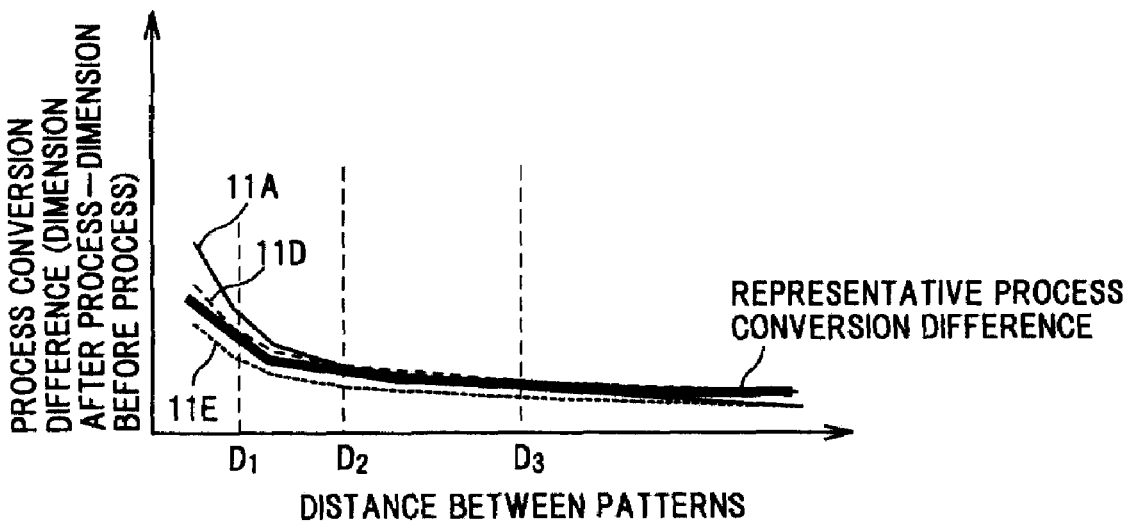

FIGS. 6A to 6C are explanatory views showing preparation examples of the etching process bias residual error amount model. As shown in FIG. 6A, the distances between the patterns and the etching process biases are obtained by using each test pattern as explained in FIG. 5. Next, as shown in FIG. 6B, representative etching process biases of the patterns (differences between predicted pattern shapes after the process and pattern shapes before the process) are obtained from, for example, average values of the etching process biases of each test pattern. Next, as shown in FIG. 6C, the relationships between the etching process bias residual error amounts and distances between the patterns are obtained. The drawing (FIG. 6C) shows only the test pattern 11A. The etching process bias residual error amount is obtained by subtracting the representative etching process bias from the etching process bias, and here is represented as $\Delta E\,t'\,g\,r = G(Slope, Imax, Imin, I\_integ, , , )$. The amount of characteristic is extracted, about every distance between the patterns, from the light intensity distribution corresponding to the distance between the patterns which has been already obtained. The amount of characteristic to be extracted includes, for example, a light intensity slope (Slope), a maximum light intensity (I max), a minimum light intensity (I min) and a neighborhood integration light intensity (I integ), but is not limited to these. Further, one or two of the light intensity slope (Slope), the maximum light intensity (I max), the minimize light intensity (I min) and the neighborhood integration light intensity (I integ) can be used. Furthermore, the above-mentioned representative etching process bias can be an average value of a maximum value and a minimum value of the etching process bias of each test pattern.

FIG. 7 is an explanatory view showing a calculation method of a neighborhood integration light intensity (I integ). The neighborhood integration light intensity (I integ) can be obtained from a convolution product (I*g) of a light intensity (I) at the point to be obtained and a function (g) for calculating the neighborhood integration light intensity (for example, Gaussian function).

A cross-reference table of the conversion difference residual error amount and the calculated amount of characteristic are prepared about every pattern as shown in Table 1. An etching process bias residual error amount model (function) composed of $\Delta Et'\,gr = G(Slope, Imax, Imin , , , )$ is prepared from the above-mentioned table by using a multiple regression method and the like.

TABLE 1

| $\Delta Et'\,g\_r$ | Slope | Imax | Imin | ... |
|---|---|---|---|---|
| $\Delta Et'\,g\_r\_1$ | Slope1 | Imax1 | Imin1 | ... |
| $\Delta Et'\,g\_r\_2$ | Slope2 | Imax2 | Imin2 | ... |
| $\Delta Et'\,g\_r\_3$ | Slope3 | Imax3 | Imin3 | ... |
| . | . | . | . | |
| . | . | . | . | |
| . | . | . | . | |

Next, the etching process bias residual error amounts are obtained at the positions of evaluation points by using the etching process bias residual error amount model (S18), and it is determined whether a following value is less than a permissible value or not (S19), the value to be determined being an absolute value of the difference obtained by subtracting a value obtained by biasing the conversion difference residual error amount based on the process calculated by using the etching process bias residual error amount model to a predicted value of the lithography shape (a second lithoshape predicted value) predicted by using the lithography conversion difference model based on the mask shape from a predicted value of the lithography target shape (a first lithoshape predicted value) predicted in view of the etching process bias based on the design data. The determination is represented by the following formula.

$$|Fetg^{-1}(Pdesign(r))-\{Flitho(Pmask(r)i)+Getg(NPresist(r)i)\}|I<\epsilon \qquad \text{formula (1)}$$

In the formula (1), $Fetg^{-1}$ (Pdesign r) represents a formula obtained by carrying out a reverse conversion to the etching process bias model and used for obtaining the resist target pattern (the first lithoshape predicted value).

Pmask (r) i represents a mask pattern shape (i means "sequential").

Flitho (Pmask(r)i) represents a predicted value of shape obtained by using the lithography conversion difference model based on the mask pattern.

Getg (NPresist (r)i) represents the etching process bias residual error amount model.

NPresist (r)i represents a factor other than contour shapes of second-dimensional pattern of the resist pattern, for example, a tension of an optical image formed in the resist.

If the left-hand side of the formula (1) is not more than the permissible value (S19: Yes), the mask target corresponding to the evaluation point position is determined (S20), and if the left-hand side of the formula (1) is more than the permissible value (S19: No), the mask target corresponding to the evaluation point position is moved (S21). The above-mentioned steps S16 to S20 are carried out about all the evaluation points (S22). Based on the above operations the mask target is determined (S23). Further, the above-mentioned mask determination method of S16 to S23 is carried out by correcting and determining the mask target position at a predetermined evaluation point, and then sequentially verifying and correcting the mask target position at the other evaluation point based on the mask target after the correction. However, it is also possible to correct and determine the mask target position at a predetermined evaluation point based on the mask target before the correction determined at S15, and simultaneously correct the mask target position at the other evaluation point and further all other evaluation points based on the mask target before the correction.

Further, the pattern shape after the etching process can be predicted from the etching process bias model and the etching process bias residual error amount model. The relationship is represented as a following formula.

$$Petch(r)=Fetg(Presist(r))+Getg(NPresist(r)) \qquad \text{formula (2)}$$

In the formula (2),

Petch (r) represents a function for defining the pattern shape after the etching.

Fetg (Presist (r)) represents the etching process bias model (a conversion function).

Getg (NPresist (r)) represents the etching process bias residual error amount model (a conversion difference residual error amount function).

Figure 8E:
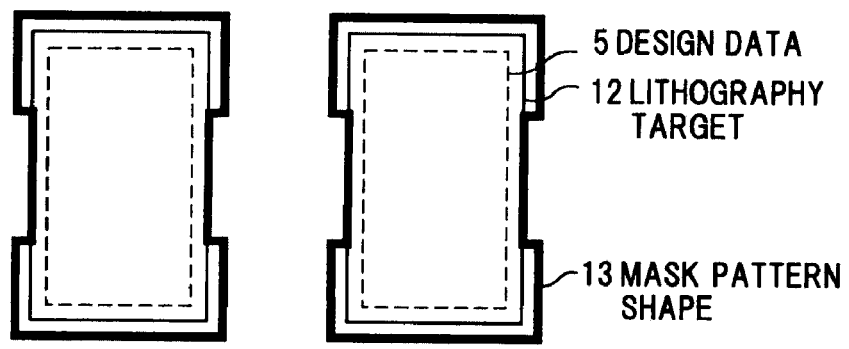

Next, cases that the above-mentioned correction flow is applied to specific patterns will be explained with reference to FIG. 8. If the conversion difference correction is carried out to the design data 5 shown in FIG. 8A (S11), a lithography target 12 (a first litho-shape predicted value) shown in FIG. 8B is formed (S12), and if the lithography conversion difference correction is similarly carried out to the lithography target 12 (S14), a mask pattern shape 13 (a mask target) shown in FIG. 8C is formed (S15). On the other hand, if the pattern shape after the lithography process is predicted from the mask pattern shape 13 by using the lithography conversion difference model, for example, a predicted pattern shape after the lithography 14 with an oval shape shown in FIG. 8D is obtained. Here, the mask pattern shape 13 is adjusted and obtained so that the predicted pattern shape after the lithography 14 conforms to the lithography target 12. However, as shown in FIG. 8D, the lithography target 12 may not perfectly conform to the predicted pattern shape after the lithography 14 due to accuracy problems of the simulation model and the conversion difference correction. However, if a workpiece film is fabricated by using the pattern shape 14 as a resist pattern, as described above, the etching process bias residual error is produced. Therefore, it is needed to determine the lithography target in view of the etching process bias residual error amount. Further, it is necessary to calculate the mask pattern shape appropriate for forming the pattern shape after the lithography.

Figure 8F:
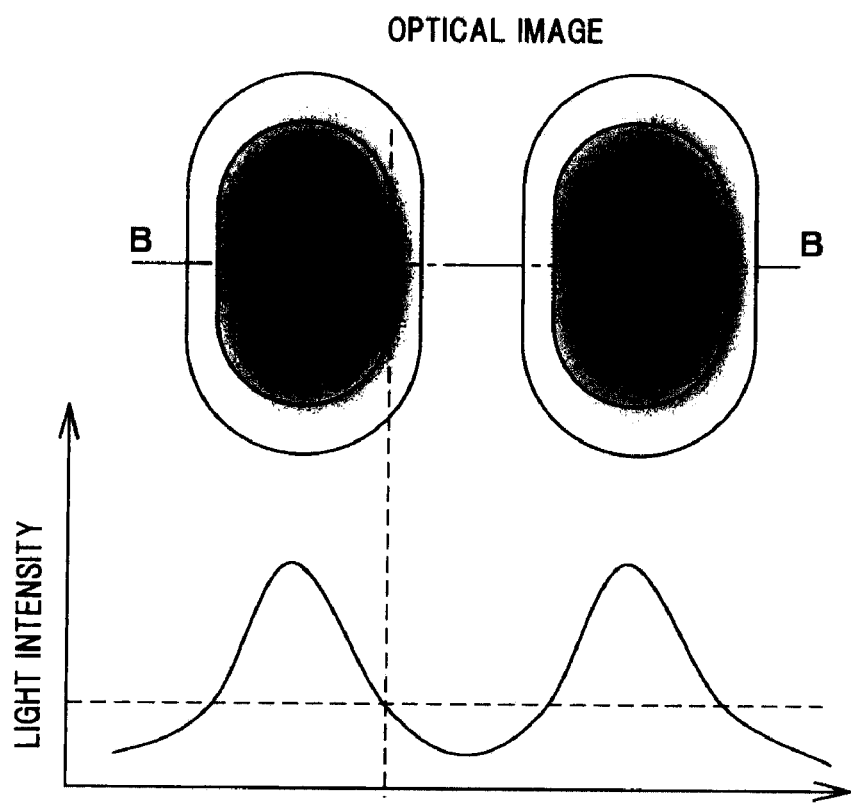
Figure 8G:
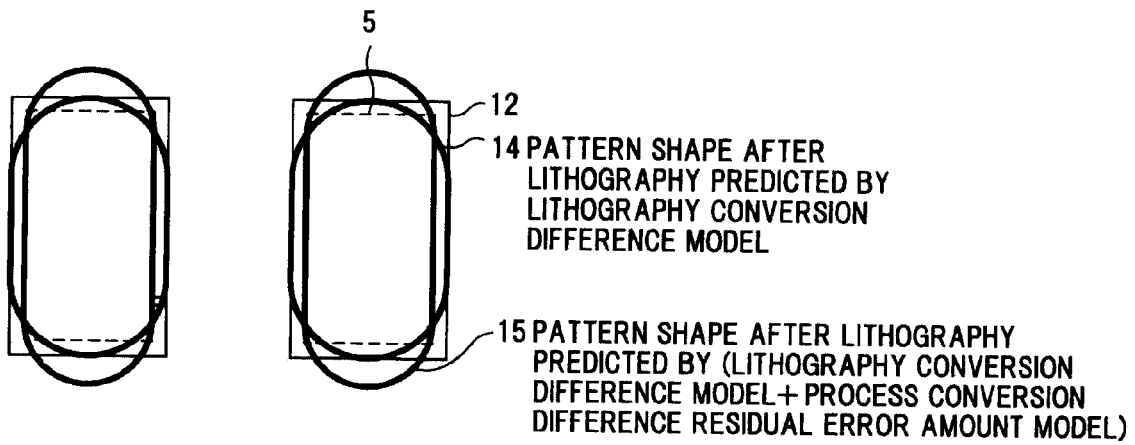
Figure 8H:
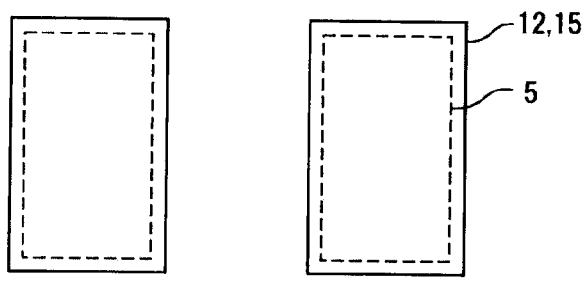
Figure 8I:
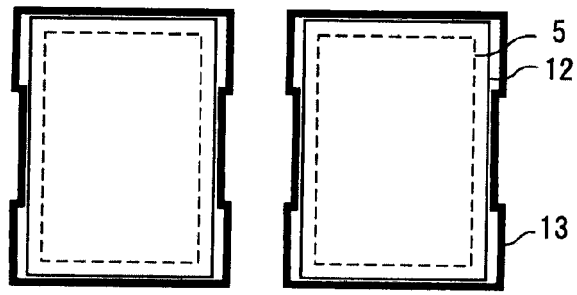

Consequently, as shown in FIG. 8F, an optical image (latent image) to be formed in a resist film is calculated based on the mask pattern shape 13 determined in FIG. 8D (S16), the etching process bias residual error amount is calculated from the light intensity distribution shown in FIG. 8F, and the etching process bias residual error amount model is prepared from the etching process bias residual error amount (S17). In this regard, the etching process bias residual error amount model need not be prepared based on the mask pattern shape 13, and can be prepared based on a test mask pattern and the like separately. Alternatively, the etching process bias residual error amount model preliminarily prepared can be read out. FIG. 8F shows the light intensity on the line B-B of FIG. 8F. If the pattern shape after the lithography is predicted from the mask pattern shape 13 by using the lithography conversion difference model and further the conversion difference residual error amount using the etching process bias residual error amount model is biased, the pattern shape after the lithography (a second litho-shape predicted value) 15 is obtained shown in FIG. 8G. At this stage, there is a shape difference between the pattern shape 15 of the second lithoshape predicted value and the lithography target 12. Thus, as shown in FIG. 8H, the mask pattern shape 13 is changed so that the pattern shape 15 of the second litho-shape predicted value conforms to the lithography target 12 or can be kept within the permissible value, and for example, as shown in FIG. 8I, the longitudinal length of the mask pattern shape 13 is corrected so as to become somewhat shorter, the central width is corrected so as to become somewhat longer, and the mask pattern shape 13 in which the etching process bias residual error amount is minimized, in other words, the mask target is determined. Further, the mask target determination method shorn in FIG. 8B verifies by comparing the predicted pattern shape 15 obtained by biasing the etching process bias residual error amount to the predicted pattern shape after the lithography 14 with the lithography target 12 obtained by applying the etching process bias correction to the design data. However, as the other method, a following method can be used, the method including the steps of biasing the etching process bias residual error amount to the lithography target 12 obtained by applying the etching process bias correction to the design data so that newly a lithography target is determined, adjusting the predicted pattern shape after the lithography 14 so as to conform to the lithography target newly determined, repeating verifications whether it is within the permissible value or not, and correcting and determining the mask target.

According to the process proximity correction method of the present embodiment, the final pattern can be predicted with a high degree of accuracy and the drawing data for preparing the mask pattern can be corrected with a high degree of accuracy.

Further, FIG. 2B shows that the method of the present embodiment has a procedure that if the steps S16 to S20 are not completed about all the evaluation points in the step S22 (S22: No) the steps return to the step S16, but instead of returning to the step S16, the mask pattern shape can be changed so that the lithography pattern shape predicted from the mask pattern by using the lithography conversion difference model conforms to the lithography target or can be kept within the permissible value (S21). Consequently, the calculation time can be shortened in comparison with FIG. 2B.

Second Embodiment

A pattern prediction method and pattern correction method according to the second embodiment includes a first processing step of obtaining a lithography conversion difference model (a conversion function) that makes the connection between a mask pattern (a first pattern) formed by a mask process (a first step) and a resist pattern (a second pattern) formed by a lithography process (a second step) based on contour shapes of the patterns, a second processing step of obtaining a lithography conversion difference residual error amount model (a conversion difference residual error amount function) that makes the connection between a residual error amount between a predicted shape of the resist pattern obtained from the lithography conversion difference model and the resist pattern shape actually obtained by the lithography process and factors other than the contour shapes of the patterns, a third processing step of predicting the resist pattern shape from the mask pattern by using the conversion function and the conversion difference residual error amount function, and a fourth processing step of correcting the mask pattern shape from the predicted resist pattern shape.

The resist pattern shape can be predicted by a following formula.

$$Presist(r) = Flitho(Pmask(r)) + Glitho(NPmask(r)) \quad \text{formula (3)}$$

In the formula (3),

Presist (r) represents a function for defining the resist pattern shape.

Flitho (Pmask (r)) represents the lithography conversion difference model (the conversion function).

Glitho (NPmask (r)) represents the lithography conversion difference residual error amount model (the conversion difference residual error amount function).

As to the lithography conversion difference residual error amount model, an electron beam intensity distribution formed in a mask material at the time of mask pattern fabrication can be used as a factor other than the contour shape of the pattern.

According to the pattern prediction method and pattern correction method of the second embodiment, the resist pattern can be predicted with a high degree of accuracy and the mask pattern cart be corrected with a high degree of accuracy. Further, when a comparison between the predicted pattern shape and the resist pattern shape preliminarily determined as a target pattern is made and the difference thereof is verified whether it is less than the permissible value or not, if the value is not less than the permissible value, the mask pattern can be appropriately corrected so as to satisfy the permissible condition. Furthermore, the pattern prediction method and pattern correction method explained in the present embodiment can be combined with the pattern prediction method and pattern correction method explained in the first embodiment. That is to say, a following pattern prediction method and pattern correction method can be used, the method including the steps of predicting the resist pattern shape from the mask pattern shape by using the lithography conversion difference model (the first conversion function) and the lithography conversion difference residual error amount model (the first conversion difference residual error amount function), and predicting the patterns after the process from the predicted resist pattern using the etching process bias model (the second conversion function) and the etching process bias residual error amount model (the second conversion difference residual error amount function). Additionally, the pattern correction method explained in the first embodiment can include the step of predicting the pattern shape after the lithography by additionally using the above-mentioned the lithography conversion difference residual error amount model, at the time of predicting the pattern shape after the process 15 from the mask pattern shape 13 shown in FIG. 8B. The mask pattern shape can be corrected and determined so that the predicted result conforms to the lithography target 12 or can be kept within the permissible value. Further, the following method can be also used, the method including the steps of predicting the pattern shape after the process from the mask pattern shape by using at least the lithography conversion difference model and the etching process bias model, or the lithography conversion difference residual error amount model and the etching process bias residual error amount model, and correcting the mask pattern shape based on the comparative verification between the pattern after the process and the design pattern.

Third Embodiment

A method of fabricating a semiconductor device according to the third embodiment includes a step of transcribing a transcription pattern determined by a following transcription pattern determination step onto a semiconductor substrate, the transcription pattern determination step including the steps of measuring a difference between the pattern shape predicted by using the pattern shape conversion described in the pattern prediction methods according to the first and second embodiments; and the target pattern (for example, the design pattern or the lithography target pattern), and determining the pattern before the conversion (for example, the resist pattern or the mask pattern) as a transcription pattern to be transcribed onto the semiconductor substrate if the measured difference is less than a permissible value, or determining a pattern obtained by correcting the pattern before the conversion so that the measured difference becomes less than the permissible value as the transcription pattern if the measured difference is equal or more than the permissible value. The transcription pattern is transcribed onto a workpiece film such as an insulation film, a semiconductor film or a conductive film formed on the semiconductor substrate by the lithography process or the etching process.

Fourth Embodiment

Figure 9:
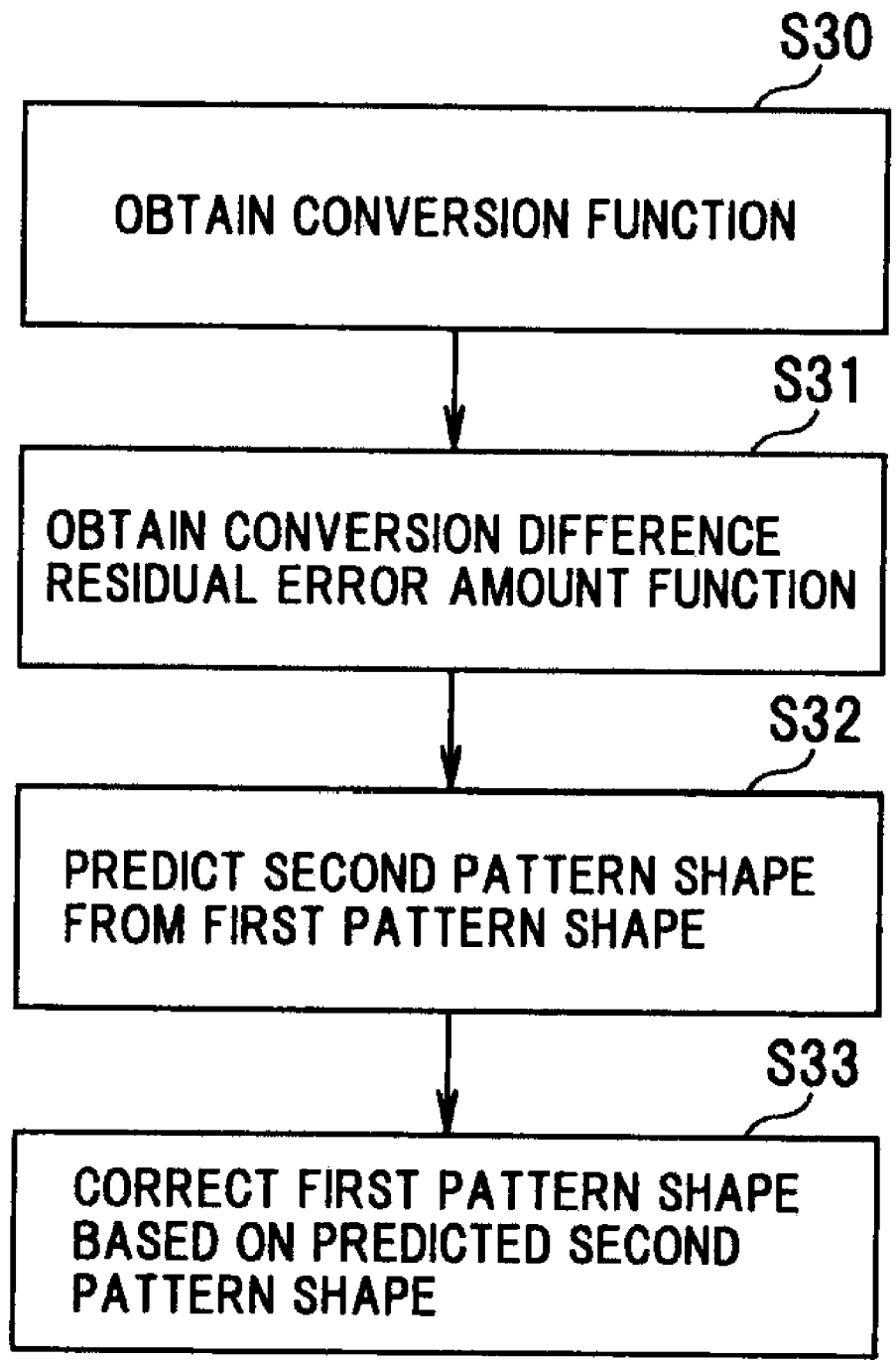
FIG. 9 is a flowchart showing an example of a pattern correction method.
Figure 10:
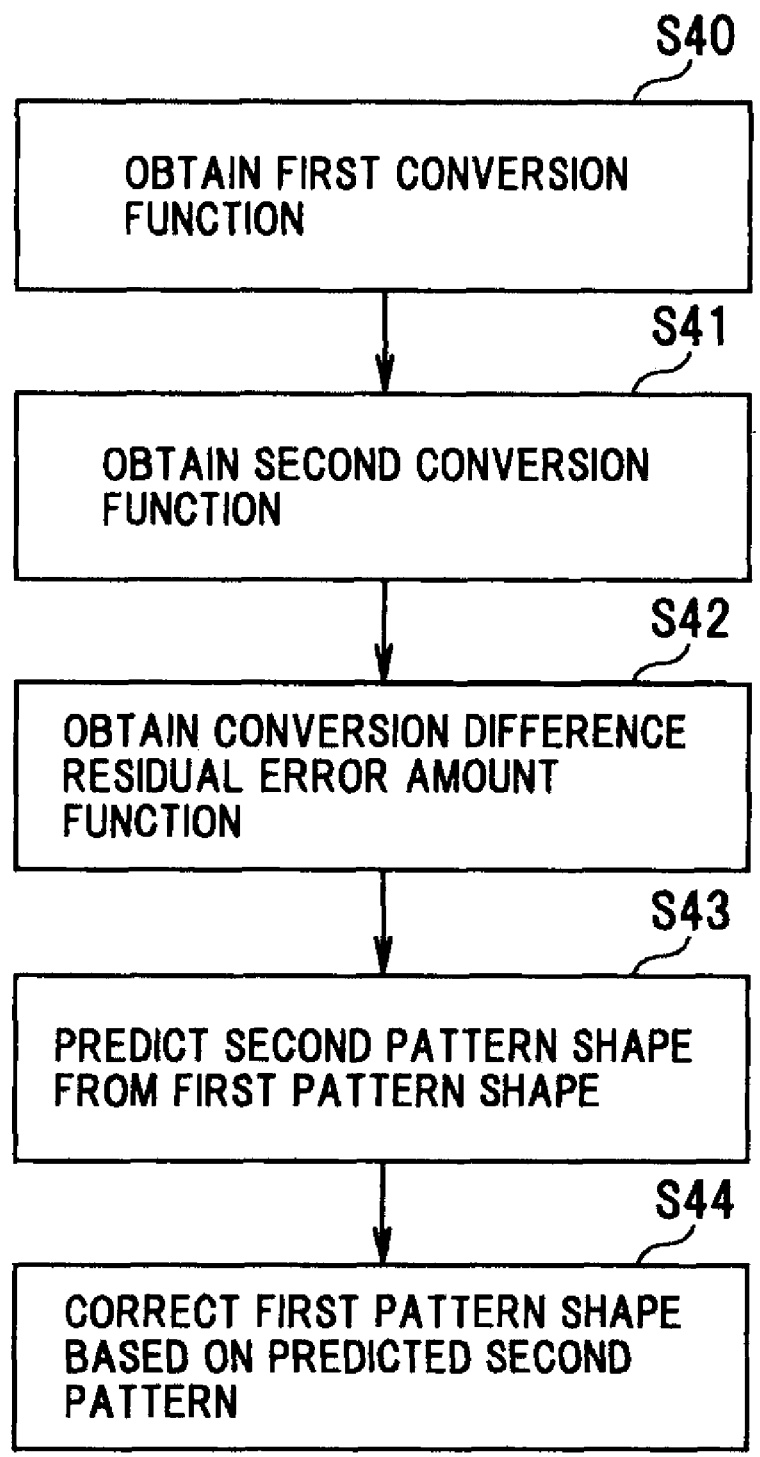
FIG. 10 is a flowchart showing an example of a pattern correction method.
Figure 11:
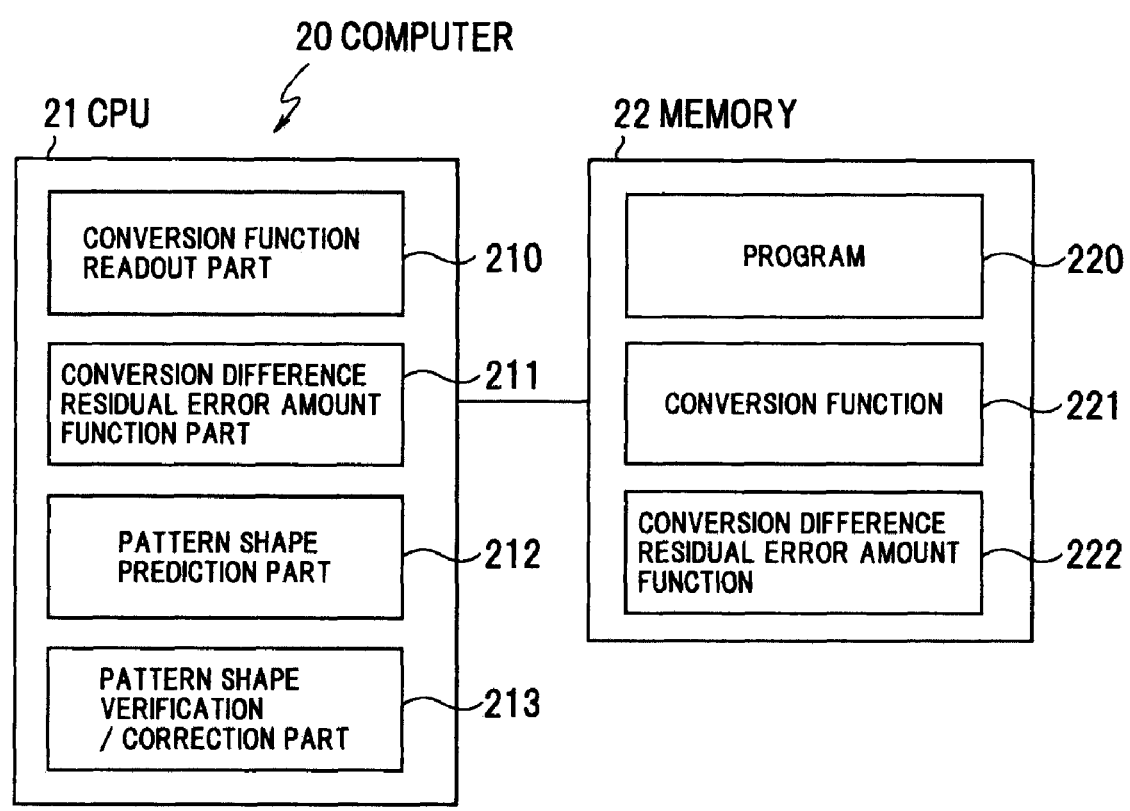
FIG. 11 is an explanatory view showing a computer to execute instructions of the program shown in FIG. 9.
Figure 12:
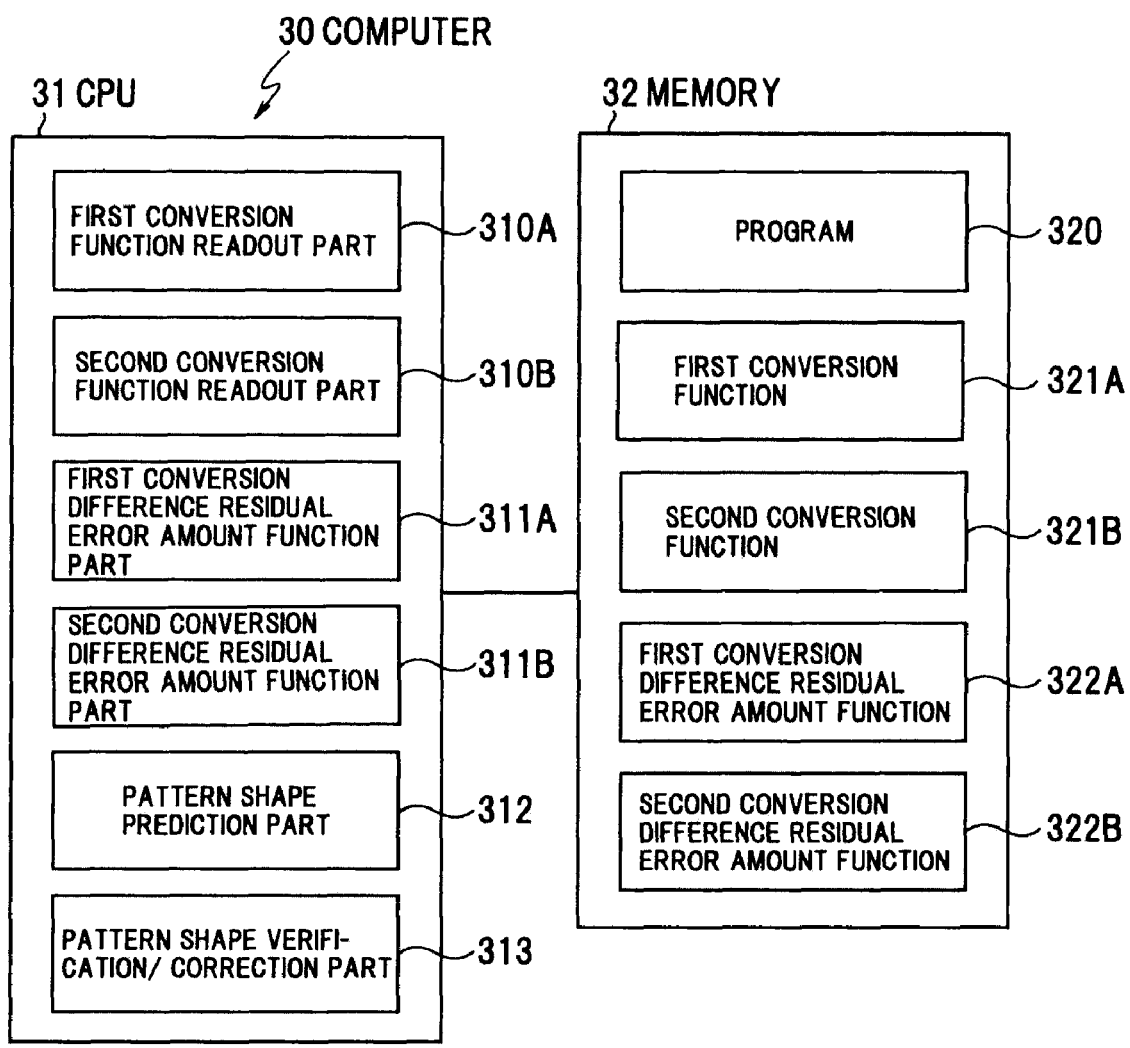
FIG. 12 is an explanatory view showing a computer to execute instructions of the program shown in FIG. 10.

A computer program product according to the fourth embodiment is configured to make a computer shown in FIGS. 11 to 12 execute the pattern prediction method and pattern correction method as the steps shown in FIGS. 9 to 10. the computer program product can be provided in a state of being recorded in a computer readable recording media, and can be provided by being downloaded from a server via a network such as the internet.

FIG. 9 shows a flowchart about a first example of a pattern correction method. FIG. 11 shows a computer to execute instructions of the program shown in FIG. 9. A computer 20 includes a CPU 21 and a memory 22. In the memory 22, a program 220, a conversion function 221, and a conversion difference residual error amount function 222 are recorded in a computer 20-readable state. The CPU 21 is configured to function as a conversion function readout part 210, a conversion difference residual error amount function part 211, a pattern shape prediction part 212 and a pattern shape verification/correction part 213 by operating according to the program 220 stored in the memory 22. The conversion function 221 is readout from the memory 22 at the conversion function readout part 210, the conversion function 221 making the connection between a first pattern formed by a first step and a second pattern formed by a second step following the first step based on contour shapes of the first pattern and the second pattern (S30), the conversion difference residual error amount function 222 is readout from the memory 22 at the conversion difference residual error amount function part 211, the conversion difference residual error amount function 222 making the connection between a residual error amount between a predicted shape of the second pattern obtained from the conversion function and the second pattern shape obtained by actually using the second step, and factors other than the contour shapes of the first pattern and the second pattern (S31), the second pattern shape is predicted from the first pattern shape by using the conversion function 221 and the conversion difference residual error amount function 222 at the pattern shape prediction part 212 (S32), and the first pattern shape is corrected based on the comparative verification between the predicted second pattern shape and the target pattern shape at the pattern shape verification/correction part 213 (S33).

FIG. 10 shows a flowchart about a second example of a pattern correction method. FIG. 12 shows a computer to execute instructions of the program shown in FIG. 10. A computer 30 includes a CPU 31 and a memory 32. In the memory 32, a program 320, a first conversion function 321A, a second conversion function 321B, a first conversion difference residual error amount function 322A and a second conversion difference residual error amount function 322B are recorded in a computer 30-readable state. The CPU 31 is configured to function as a first conversion function readout part 310A, a second conversion function readout part 310B, a first conversion difference residual error amount function part 311A, a second conversion difference residual error amount function part 311B, a pattern shape prediction part 312 and a pattern shape verification/correction part 313 by operating according to the program 320 stored in the memory 32. The first conversion function 321A is readout from the memory 32 at the first conversion function readout part 310A, the first conversion function 321A making the connection between a first pattern formed by a first step and a second pattern formed by a second step following the first step based on contour shapes of the first pattern and the second pattern (S40), the second conversion function 321B is readout from the memory 32 at the second conversion function readout part 310B, the second conversion function 321B making the connection between the second pattern formed by the second step and the third pattern formed by the third step following the second step based on contour shapes of the second pattern and the third pattern (S41), the first conversion difference residual error amount functions 322A is readout from the memory 32 at the first conversion difference residual error amount function part 311A, the first conversion difference residual error amount function 322A making the connection between a residual error amount between a predicted shape of the second pattern obtained from the first conversion function 321A and the second pattern shape obtained by actually using the second step, and factors other than the contour shapes of the first pattern and the second pattern, or the second conversion difference residual error amount functions 322B is readout from the memory 32 at the second conversion difference residual error amount function part 311B, the second conversion difference residual error amount function 322B making the connection between a residual error amount between a predicted shape of the third pattern obtained from the second conversion function 321B and the third pattern shape obtained by actually using the third step, and factors other than the contour shapes of the second pattern and the third pattern (S42), the third pattern shape is predicted from the first pattern shape by using the first conversion function 321A, the second conversion function 321B, and the first or second conversion difference residual error amount function 322A, 322B at the pattern shape prediction part 312 (S43), and the first pattern shape is corrected based on the comparative verification between the predicted third pattern shape and the target pattern shape at the pattern shape verification/correction part 313 (S44).

Further, it should be noted that the present invention is not intended to be limited to the above-mentioned first to fourth embodiments, and the various kinds of changes thereof can be implemented by those skilled in the art without departing from the gist of the invention.

For example, the present invention can be also applied to the case of forming the resist pattern by using an electron beam lithography without using a mask. Consequently, the mask fabrication can be omitted. Further, in the first and second embodiments, a prediction method and a correction method are shown, but the prediction method can be also applied to a so-called verification method that includes steps of predicting the pattern shape after process by applying to the mask data and the like and comparing with the desired design data. As a result, it is clear that the verification can be carried out with a higher degree of accuracy.

What is claimed is:

1. A pattern prediction method comprising:
predicting a second pattern shape from a first pattern shape by using a conversion function and a conversion difference residual error amount function, wherein;
the conversion function makes the connection between the first pattern formed by a first step and the second pattern formed by a second step following the first step based on contour shapes of the first pattern and the second pattern, and
the conversion difference residual error amount function makes the connection between a residual error amount between a predicted shape of the second pattern obtained from the conversion function and the second pattern shape obtained by actually using the second step, and factors other than the contour shapes of the first pattern and the second pattern.

2. The pattern prediction method according to claim 1, wherein;
the first step is a lithography process,
the first pattern is a resist pattern,
the second step is an etching process, and
the second pattern is a workpiece film pattern.

3. The pattern prediction method according to claim 2, wherein;
the factor other than the contour shapes of the patterns is an amount of characteristic of light intensity distribution formed in a resist film during the lithography process.

4. The pattern prediction method according claim 3, wherein;
the amount of characteristic of light intensity distribution comprise at least one of light intensity slope, maximum light intensity, minimum light intensity and neighborhood integration light intensity.

5. The pattern prediction method according to claim 4, wherein;
the conversion difference residual error amount function comprises at least two of the light intensity slope, the maximum light intensity, the minimum light intensity and the neighborhood integration light intensity.

6. The pattern prediction method according to claim 1, wherein;
the first step is a mask process,
the first pattern is a mask pattern,
the second step is a lithography process, and
the second pattern is a resist pattern.

7. The pattern prediction method according to claim 6, wherein;
the factor other than contour shapes of the patterns is an electron beam intensity distribution formed in a substrate for a mask during the mask process.

8. A pattern correction method comprising:
predicting a second pattern shape from a first pattern shape by using a conversion function and a conversion difference residual error amount function, wherein;
the conversion function makes the connection between the first pattern formed by a first step and the second pattern formed by a second step following the first step based on contour shapes of the first pattern and the second pattern, and
the conversion difference residual error amount function makes the connection between a residual error amount between a predicted shape of the second pattern obtained from the conversion function and the second pattern shape obtained by actually using the second step, and factors other than the contour shapes of the first pattern and the second pattern, and
correcting the first pattern shape in accordance with the predicted second pattern shape.

9. The pattern correction method according to claim 8, wherein;
the correction of the first pattern is carried out by measuring a difference between the second pattern and a target pattern, and if the difference is less than a permissible value the first pattern is determined as a transcription pattern, and if the difference is equal or more than the permissible value, the first pattern is corrected so that the residual error amount becomes less than the permissible value.

10. A pattern prediction method comprising:
predicting a third pattern shape from a first pattern shape by using a first conversion function, a second conversion function and a first conversion difference residual error amount function or a second conversion difference residual error amount function, wherein;
the first conversion function makes the connection between the first pattern formed by a first step and the second pattern formed by a second step following the first step based on contour shapes of the first pattern and the second pattern,
the second conversion function makes the connection between the second pattern formed by the second step and the third pattern formed by a third step following the second step based on contour shapes of the second pattern and the third pattern, and
the first conversion difference residual error amount function makes the connection between a residual error amount between a predicted shape of the second pattern obtained from the first conversion function and the second pattern shape obtained by actually using the second step and factors other than the contour shapes of the first pattern and the second pattern, or
the second conversion difference residual error amount function makes the connection between a residual error amount between a predicted shape of the third pattern obtained from the second conversion function and the third pattern shape obtained by actually using the third step and factors other than the contour shapes of the second pattern and the third pattern.

11. The pattern prediction method according to claim 10, wherein;
the first step is a mask process,
the first pattern is a mask pattern,
the second step is a lithography process,
the second pattern is a resist pattern,
the third step is an etching process, and
the third pattern is a workpiece film pattern.

12. The pattern prediction method according to claim 11, wherein;
the factor other than contour shapes of the patterns made the connection by the first conversion difference residual error amount function is an electron beam intensity distribution formed in a substrate for a mask during the mask process, and
the factor other than contour shapes of the patterns made the connection by the second conversion difference residual error amount function is an amount of characteristic of light intensity distribution formed in a resist film during the lithography process.

13. A pattern correction method comprising:
predicting a third pattern shape from a first pattern shape by using a first conversion function, a second conversion function and a first conversion difference residual error amount function or a second conversion difference residual error amount function, wherein;
the first conversion function makes the connection between the first pattern formed by a first step and the second pattern formed by a second step following the first step based on contour shapes of the first pattern and the second pattern,
the second conversion function makes the connection between the second pattern formed by the second step and the third pattern formed by a third step following the second step based on contour shapes of the second pattern and the third pattern, and
the first conversion difference residual error amount function makes the connection between a residual error amount between a predicted shape of the second pattern obtained from the first conversion function and the second pattern shape obtained by actually using the second step and factors other than the contour shapes of the first pattern and the second pattern, or
the second conversion difference residual error amount function makes the connection between a residual error amount between a predicted shape of the third pattern obtained from the second conversion function and the third pattern shape obtained by actually using the third step and factors other than the contour shapes of the second pattern and the third pattern, and correcting the first pattern shape in accordance with the predicted third pattern shape.

14. A method of fabricating a semiconductor device comprising:
   transcribing a transcription pattern determined by a transcription pattern determination step onto a semiconductor substrate, wherein the transcription pattern determination step comprises;
   measuring a difference between a second pattern predicted from a first pattern shape and a target pattern by using a conversion function and a conversion difference residual error amount function, wherein the conversion function makes the connection between the first pattern formed by a first step and the second pattern formed by a second step following the first step based on contour shapes of the first pattern and the second pattern, and the conversion difference residual error amount function makes the connection between a residual error amount between a predicted shape of the second pattern obtained from the conversion function and the second pattern shape obtained by actually using the second step, and factors other than the contour shapes of the first pattern and the second pattern, and
   determining the first pattern as a transcription pattern if the difference is less than a permissible value, or determining a pattern obtained by correcting the first pattern so that the difference becomes less than the permissible value as the transcription pattern if the difference is equal or more than the permissible value.

15. A computer-readable recording media comprising:
   a computer program recorded thereon, the computer program being configured to instruct a computer to execute a step of predicting a second pattern shape from a first pattern shape by using a conversion function and a conversion difference residual error amount function, wherein;
   the conversion function makes the connection between the first pattern formed by a first step and the second pattern formed by a second step following the first step based on contour shapes of the first pattern and the second pattern, and
   the conversion difference residual error amount function makes the connection between a residual error amount between a predicted shape of the second pattern obtained from the conversion function and the second pattern shape obtained by actually using the second step, and factors other than the contour shapes of the first pattern and the second pattern.

16. The pattern verification method according to claim 15, wherein,
   the first step is a lithography process,
   the first pattern is a resist pattern,
   the second step is an etching process, and
   the second pattern is a workpiece film pattern.

17. The pattern verification method according to claim 15, wherein;
   the first step is a mask process,
   the first pattern is a mask pattern,
   the second step is a lithography process, and
   the second pattern is a resist pattern.

18. A computer-readable recording media comprising:
   a computer program recorded thereon, the computer program being configured to instruct a computer to execute a step of predicting a third pattern shape from a first pattern shape by using a first conversion function, a second conversion function and a first conversion difference residual error amount function or a second conversion difference residual error amount function, wherein;
   the first conversion function makes the connection between the first pattern formed by a first step and the second pattern formed by a second step following the first step based on contour shapes of the first pattern and the second pattern,
   the second conversion function makes the connection between the second pattern formed by the second step and the third pattern formed by a third step following the second step based on contour shapes of the second pattern and the third pattern, and
   the first conversion difference residual error amount function makes the connection between a residual error amount between a predicted shape of the second pattern obtained from the first conversion function and the second pattern shape obtained by actually using the second step and factors other than the contour shapes of the first pattern and the second pattern, or
   the second conversion difference residual error amount function makes the connection between a residual error amount between a predicted shape of the third pattern obtained from the second conversion function and the third pattern shape obtained by actually using the third step and factors other than the contour shapes of the second pattern and the third pattern.

* * * * *